United States Patent [19]

Price et al.

[11] Patent Number: 5,736,796
[45] Date of Patent: *Apr. 7, 1998

[54] PRINTED CIRCUIT BOARD HAVING SPLIT VOLTAGE PLANES

[75] Inventors: Noah M. Price, Campbell; Duane M. P. Takahashi, San Jose; David C. Buuck, Santa Clara, all of Calif.

[73] Assignee: Apple Computer, Inc., Cupertino, Calif.

[*] Notice: The term of this patent shall not extend beyond the expiration date of Pat. No. 5,587,887.

[21] Appl. No.: 432,233

[22] Filed: May 1, 1995

[51] Int. Cl.$^6$ .............................. H01B 7/30; H05K 1/11
[52] U.S. Cl. ........................... 307/151; 307/147; 361/794
[58] Field of Search .................................... 307/147, 151, 307/42, 43; 361/792, 793, 794, 795, 796, 775

[56] References Cited

U.S. PATENT DOCUMENTS

| | | | |
|---|---|---|---|
| 5,053,920 | 10/1991 | Staffiere | 361/694 |
| 5,384,691 | 1/1995 | Neugebauer et al. | 361/794 |
| 5,428,506 | 6/1995 | Brown et al. | 361/794 |
| 5,497,037 | 3/1996 | Lee et al. | 307/42 |
| 5,587,887 | 12/1996 | Price et al. | 361/794 |

*Primary Examiner*—William M. Shoop, Jr.
*Assistant Examiner*—Jonathan S. Kaplan
*Attorney, Agent, or Firm*—Burns, Doane, Swecker & Mathis, L.L.P.

[57] ABSTRACT

The present invention is a printed circuit board having conductive layers split into electrically isolated voltage supply plane regions each plane region being connectable to an external supply voltage. The voltage supply plane regions are split to reduce the total number of PCB conductive layers. Voltage supply plane regions are configured to match the device voltage requirements and their placement on the PCB. In the case in which a circuit includes a device having two voltage supply requirements, a first set of the device's power supply pins are fixedly coupled to a first voltage supply plane region and a second set of the device's power supply pins are fixedly coupled to a second voltage supply plane region. In this instance, each of the first and second voltage supply plane regions are fixedly connectable to external voltage supplies or to a voltage regulator according to the voltage supply requirements of the device.

12 Claims, 7 Drawing Sheets

M=Middle layer 20 Connection
T=Top layer 30 Connection

5,736,796

PRINTED CIRCUIT BOARD HAVING SPLIT VOLTAGE PLANES

FIELD OF THE INVENTION

The present invention relates to the field of printed circuit boards, and particularly to voltage planes in printed circuit boards.

BACKGROUND OF THE INVENTION

In the electronics industry, a printed circuit board (PCB) is employed to hold and interconnect packaged integrated circuit (IC) devices and other components such as resistive and capacitive elements. The PCBs are composed of alternating layers of conductive and insulating materials. The insulating layers function to electrically isolate each of the conductive layers from one other, and are often composed of a dielectric material. The conductive layers provide the ICs and components on the PCB with a particular voltage. They can also be patterned into signal traces, to transmit signals to and from the ICs inserted on the board. For example, a conductive layer is often employed to provide supply voltages such as 5.0 volts or 3.3 volts. A conductive layer may also be used as a ground plane.

The edge of the PCB functions as a type of connector which is plugged into a conductive slot connecting it to external power supplies or other PCBs.

The IC devices inserted on a given board determine the voltage supply requirements for that board. For instance, if all of the ICs on a PCB are designed with a 5.0 volt bipolar device technology, then the PCB is designed with 5.0 volt supply and ground voltage planes. Currently, the trend in IC device technology and design is to reduce power consumption by designing the logic portion of an IC with smaller low power devices having lower voltage supply requirements and designing the input/output (I/O) driver portion of the IC with larger high power devices having higher voltage supply requirements. One example of this type of technology is the BiCMOS device technology. A circuit designed with BiCMOS device technology typically utilizes CMOS devices requiring a 3.3 volt supply and bipolar devices requiring a 5.0 volt supply.

Since PCBs are designed to accommodate the voltage requirements for the ICs employed with them, it is often necessary to redesign PCBs when new generations of a given IC are developed. In particular, when a processor device, such as the central processing unit (CPU) of a computer system, is upgraded, the I/O pins and voltage requirements of the CPU often change. As a result, the PCB must also be redesigned to accommodate the upgraded processor.

The present invention is a method that minimizes redesign of a PCB due to changes in voltage requirements of the devices that are used with it.

SUMMARY OF THE INVENTION

The present invention is a printed circuit board (PCB) having a configurable voltage supply as well as a method for implementing a configurable voltage supply PCB with a family of circuit designs. The PCB of the present invention is designed such that voltage supply planes can be configured to match the voltage requirements of the devices inserted into the PCB. In one embodiment, the PCB design is employed with several generations of circuit designs having the same interconnections between the same components and integrated circuit (IC) devices but having different voltage supply requirements.

The PCB comprises conductive layers which are split into a plurality of electrically isolated voltage planes, some of which are fixed and others of which are undefined. The fixed voltage planes are each coupled to different supply voltages provided by an external power supply. The fixed and undefined planes may be part of the same conductive layer or may be in different conductive layers. Undefined voltage planes become defined by coupling them to fixed voltage planes with insertable zero resistance jumpers to obtain a desired voltage supply plane configuration.

In another embodiment, the PCB includes the option of employing a voltage regulator to provide a voltage other than that provided by the external power supply coupled to the fixed voltage planes.

In still another embodiment, the PCB is designed to accommodate a family of circuit designs using IC devices having the same signal pins for all generations of the family. The middle conductive layer of this embodiment is split into three electrically isolated planes including: 1) an undefined I/O voltage plane, 2) an undefined core voltage plane, and 3) a fixed voltage plane providing a second voltage. The core voltage plane is positioned under the IC device. IC pins requiring core voltage are electrically connected to the core voltage plane. The I/O voltage plane is positioned around the area in which the IC device is positioned. Device pins requiring I/O voltage are coupled to the I/O voltage plane.

The fixed voltage plane is positioned on another portion of a layer other than the area defined by the core and I/O planes. The fixed voltage plane is coupled to an external power supply via an edge connector. In one embodiment of the present invention the second voltage is equal to 3.3 volts.

Finally, in another embodiment of the present invention, conductive layers are split into voltage planes each being coupled to a different fixed voltage supply in order to reduce the total number of conductive layers used in a printed circuit board. In this embodiment, the placement of devices is dependent on their voltage requirements. In one preferred embodiment having a first and second split voltage plane region, a first set of power supply pins of a given device is coupled to the first supply voltage plane region and a second set of power supply pins is coupled to the second supply voltage plane region.

DETAILED DESCRIPTION

The present invention is a generic printed circuit board design having a configurable voltage supply and a method for implementing a configurable voltage supply PCB with a family of circuit designs. In the following description, numerous specific details are set forth, such as integrated circuit type, power supply voltages, etc., in order to provide a thorough understanding of the present invention. It will be apparent, however, to one skilled in the art that these specific details need not be employed to practice the present invention. In other instances, well-known printed circuit board design and construction have not been described in detail in order to avoid unnecessarily obscuring the present invention.

Figure 1:
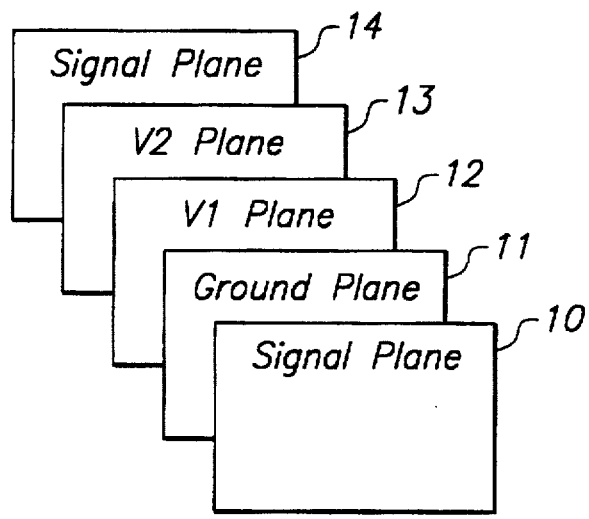
FIG. 1 illustrates the general construction of a prior art printed circuit board.

FIG. 1 illustrates the conventional construction of a prior art printed circuit board comprising separated conductive layers 10–14, including patterned signal plane layer 10, ground plane layer 11, voltage plane layer 12, voltage plane layer 13, and patterned signal plane layer 14. Although not shown in FIG. 1, conductive layers 10–14 are electrically isolated from each other with layers of insulating material. Ground planes and voltage planes have been used for several years in multi-layer PCBs. The use, design and function of these planes are well understood by those skilled in the art.

The present invention provides for more flexible selection of voltage and ground planes in various regions of a PCB by dividing any one or more such planes to cover only certain regions of a given plane. In a typical sub-divided plane, a first region is connected to a selected voltage, e.g. ground, +3.3 volts, or +5.0 volts, as in the prior art. The remainder of the plane is not contiguous with the first region, but may in turn comprise one or more separate regions, each electrically isolated from other regions in that plane. However, various jumpers or other connectors can be attached to any plane region to apply a selected voltage to the region. The net result is the possibility of providing different voltages within the same PCB plane, according to a pattern selected by an engineer or designer.

Figure 2A:
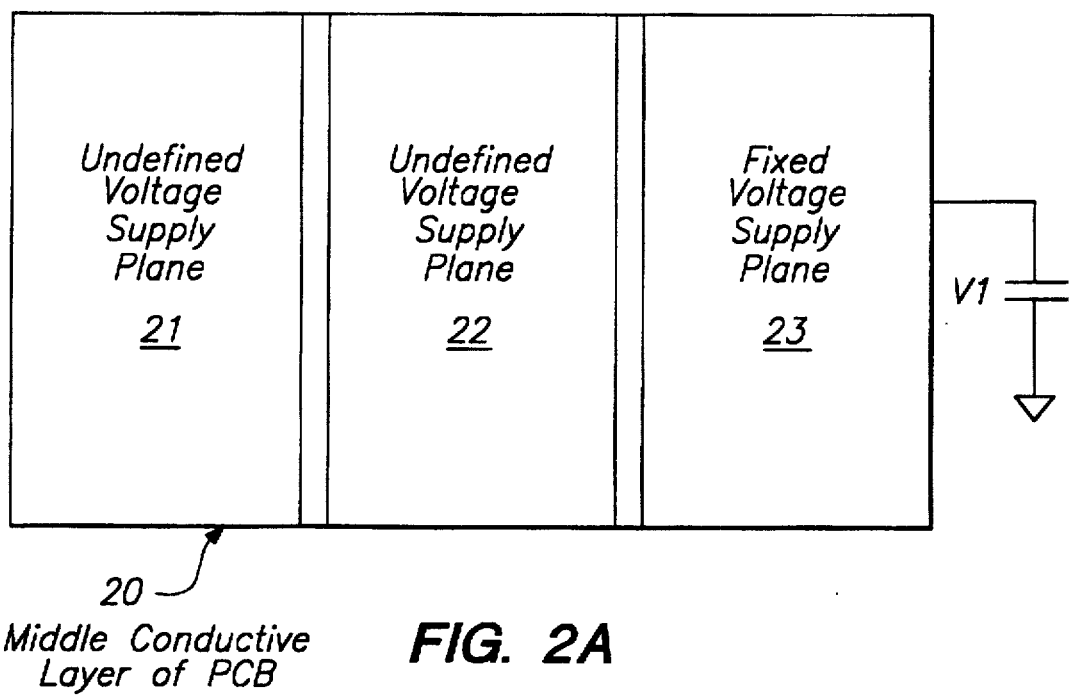
FIGS. 2A and 2B illustrate the top and middle layers of one embodiment of the configurable voltage supply printed circuit board of the present invention.
Figure 2B:
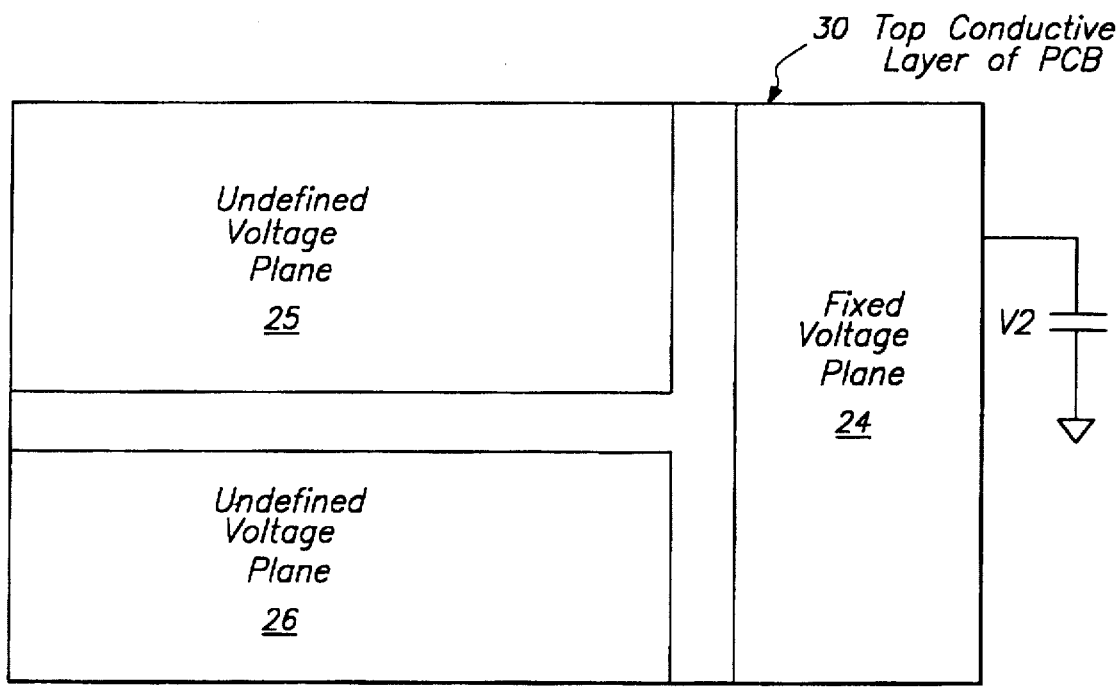

FIGS. 2A and 2B illustrate top and middle conductive layers of one embodiment of the configurable voltage supply printed circuit board of the present invention. FIG. 2A shows a middle conductive layer 20 split into three electrically isolated voltage planes 21–23. Plane 23 is a fixed voltage plane and planes 21 and 22 are undefined voltage planes. A fixed voltage plane is one that is coupled to a particular supply voltage provided by a power supply. As shown in FIG. 2A, voltage plane 23 is coupled to external power supply V1.

Also shown are undefined voltage planes 21 and 22. An undefined voltage plane is one that is not directly coupled to a power supply or to another fixed voltage plane. An undefined voltage plane becomes a defined voltage plane when it is coupled to a fixed voltage plane, either directly or indirectly through another undefined voltage plane.

FIG. 2B shows one embodiment of a top layer 30 of the PCB of the present invention. Top layer 30 is split into three voltage planes—undefined voltage planes 25 and 26 and fixed voltage plane 24 which is coupled to external power supply V2.

Figure 2C:
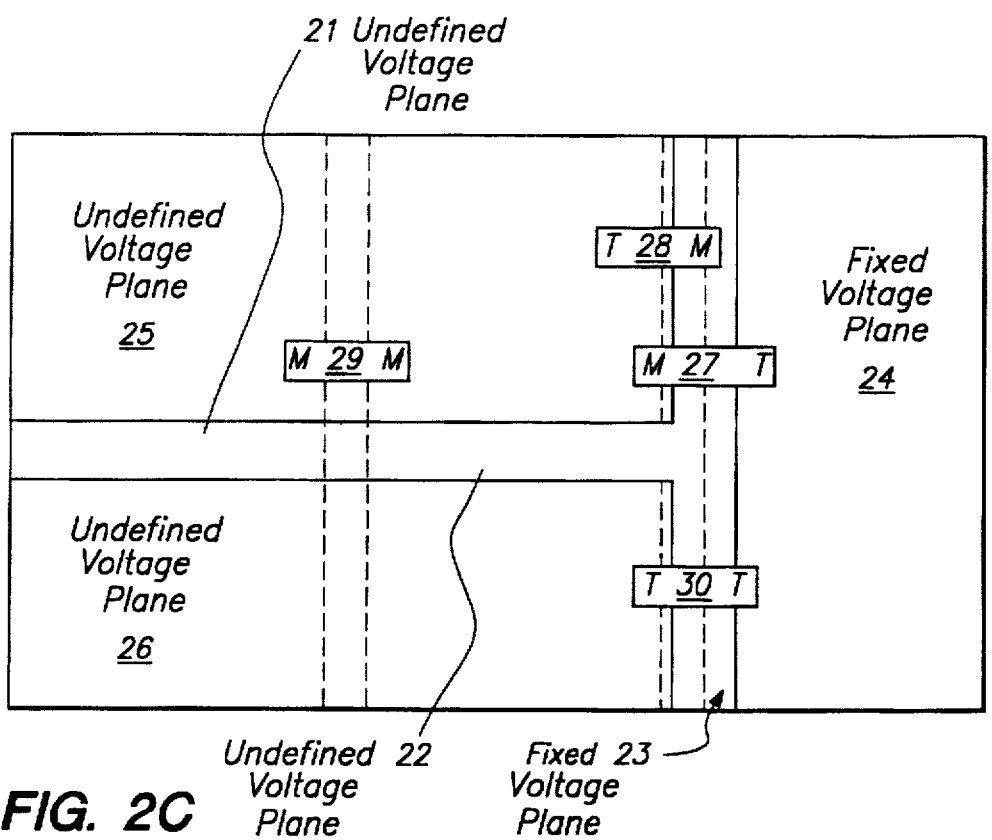
FIG. 2C illustrates the top and middle layers shown in FIGS. 2A and 2B having voltage planes strapped together to configure voltage supply planes, in accordance with the present invention.

FIG. 2C shows top layer 30 positioned on top of middle layer 20 and employing jumper straps 27–30 to configure voltage supply planes. It is to be understood that an insulating layer is disposed between the top and middle layers. In one embodiment, jumper straps 27–30 are zero ohm resistors. However, any removable component that provides a conductive path can be utilized. The jumper straps are soldered into predrilled holes depending on the desired voltage configuration. The locations of the predrilled holes are dependent on the desired configuration options. Jumper straps may strap from a top to a middle layer, from a middle layer to a middle layer, or from a top to a top layer.

Referring to FIG. 2C, jumper 27 straps fixed top voltage plane 24 (having an associated voltage supply V2) to undefined middle plane 22, thereby establishing plane 22 with a voltage equal to V2. Jumper 28 functions to strap fixed middle plane 23 (having an associated voltage V1) to undefined top plane 25 thereby defining plane 25 with a voltage equal to V1. Jumper 29 straps undefined middle plane 22 to undefined middle plane 21. Since undefined middle plane 22 is defined by fixed plane 24, then undefined middle plane 21 is also defined by fixed plane 24. Consequently, undefined middle plane 22 has an associated voltage equal to V2. Jumper 30 straps fixed top plane 24 to undefined top plane 26, thereby defining plane 26 with a voltage equal to V2. Thus, for the embodiment shown in FIG. 2C, $V_{plane\ 22} = V_{plane\ 24} = V_{plane\ 21} = V_{plane\ 26} = V_2$ and $V_{plane\ 23} = V_{plane\ 25} = V1$.

The potential placement of jumpers, and consequently, holes in which the jumpers may optionally be inserted into is determined when designing the PCB. The placement of the holes takes into account what future voltage requirements might be for that particular family of circuit designs. For instance, if it is known that a particular undefined plane might require one voltage supply in one circuit design, and a different voltage supply in a subsequent circuit design in the same family, then the PCB is designed such that the undefined plane can be jumpered to one or the other voltage, depending on which circuit design is being implemented with the PCB. As an example, if in future designs it is desired that $V_{plane\ 26} = V1$ (FIG. 2C) instead of V2, jumper 30 can be removed and a jumper strapping $V_{plane\ 23}$ to $V_{plane\ 26}$ can be inserted.

Figure 3A:
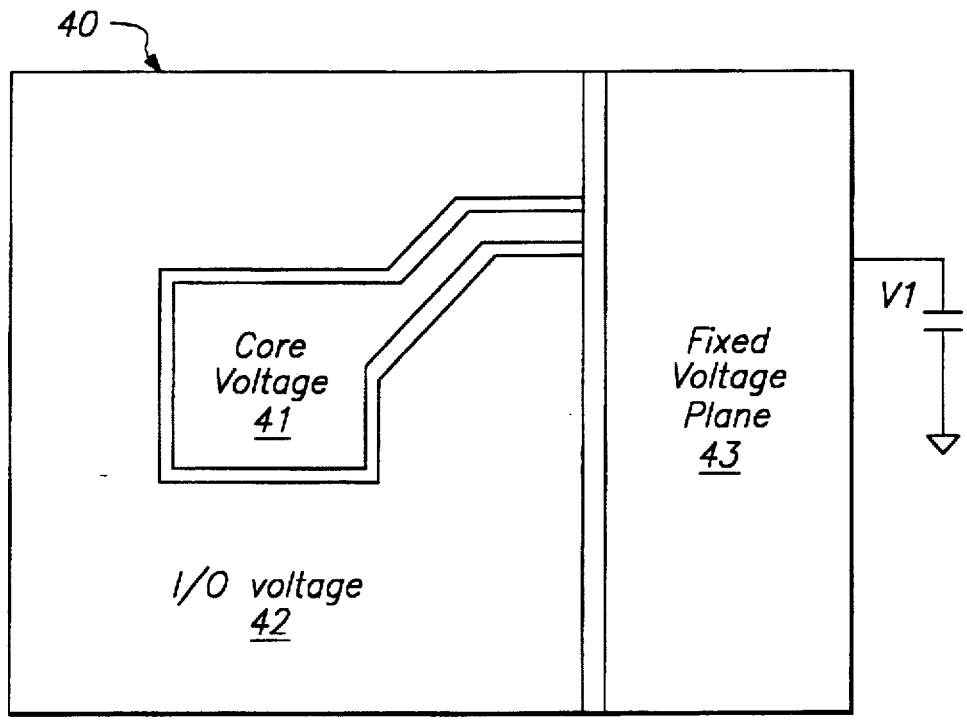
FIGS. 3A and 3B illustrate the top and middle layers of another embodiment of the configurable voltage supply printed circuit board of the present invention.
Figure 3B:
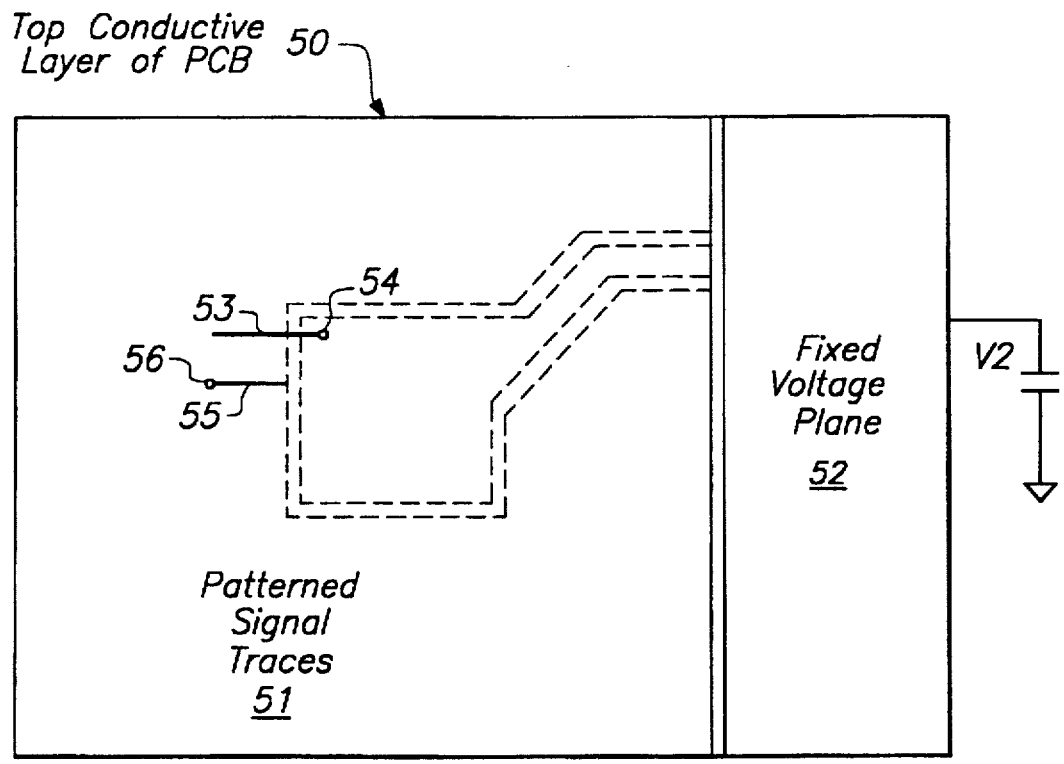

FIGS. 3A–3B illustrate top layer 40 and middle layer 50 of one embodiment of the PCB of the present invention that is employed with a family of circuit designs using several generations of an IC device each potentially having unique voltage requirements. For instance, one IC device may be designed using a 5.0 volt bipolar device technology and therefore may require that 5.0 volts be applied to all power pins of the device. In another case, a voltage of 5.0 volts may be needed for the input/output (I/O) driver power pins and 3.3 volts for all other core circuitry power pins. In this case, voltages of 5.0 volts and 3.3 volts are required. In one embodiment of the present invention, the IC device is a central processing unit (CPU) of a computer system.

FIG. 3A shows middle conductive layer 40 being split into three electrically isolated voltage planes: undefined core voltage plane 41, undefined I/O voltage plane 42, and fixed voltage plane 43. Plane 43 is coupled to power supply V1 and thus plane 43 provides a voltage level equal to V1. Undefined core voltage plane 41 is positioned directly below the area in which the processor device is to be placed whereas I/O plane 42 covers the area outside of the core voltage plane. The IC device design employed with this embodiment of the PCB of the present invention is such that some of the power supply pins are designated as core voltage pins and others are designated as I/O voltage pins. In order for the same PCB design to be used for a family of ICs, the positions of the power supply pins as well as the other pins must remain essentially the same for all ICs in the family.

The core voltage is typically the voltage required to power the low power logic devices of the circuit design; whereas the I/O voltage is typically the voltage required to power the high power devices of the circuit design. FIG. 3B illustrates top conductive layer 50 split into a fixed voltage plane 52 (coupled to power supply V2) and patterned area 51 that provides the interconnect signal traces to the IC device and to any other device or component on the board. FIG. 3B does not explicitly illustrate each trace in patterned area 51, but it is to be understood that area 51 is representative of a plurality of signal traces.

FIG. 3B also shows the manner in which a top signal trace is coupled to either the core voltage plane or the I/O voltage plane. FIG. 3B shows two signal traces 53 and 55. Since each power supply pin of the IC is designated for coupling to a particular voltage supply plane (i.e. either core or I/O), each corresponding top layer power supply signal trace is coupled to either of the core or I/O voltage planes. In FIG. 3B, signal trace 53 is a signal line designated for coupling to the core supply voltage plane and trace 55 is a signal line designated for coupling to the I/O supply voltage plane.

The IC power supply pin corresponding to trace 53 is solder mounted to the board such that an electrical connection is made between the pin and trace 53. As shown in FIG. 3B, trace 53 extends under the IC device area to a conductivity coated hole 54. Hole 54 cuts through to the middle layer 40 to core voltage supply plane 41, making an electrical connection between the device pin and the core voltage plane.

Similarly, the IC power supply pin corresponding to trace 55 is solder mounted to trace 55 to make an electrical connection. Trace 55 extends outward from the IC device area to conductivity coated hole 56. Hole 56 is cut through to middle layer 40 to the I/O voltage supply plane 42.

Figure 3C:
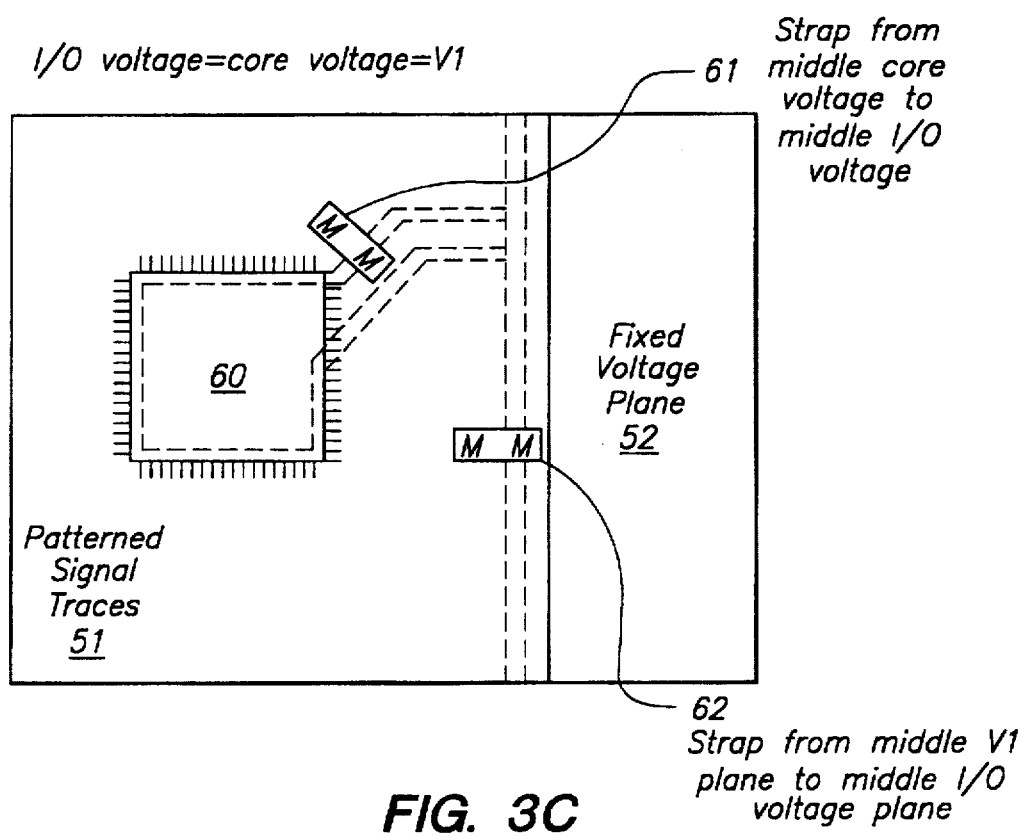
FIG. 3C–3E illustrate the top and middle layers shown in FIG. 3A and 3B having voltage planes strapped together in various voltage supply configurations.
Figure 3D:
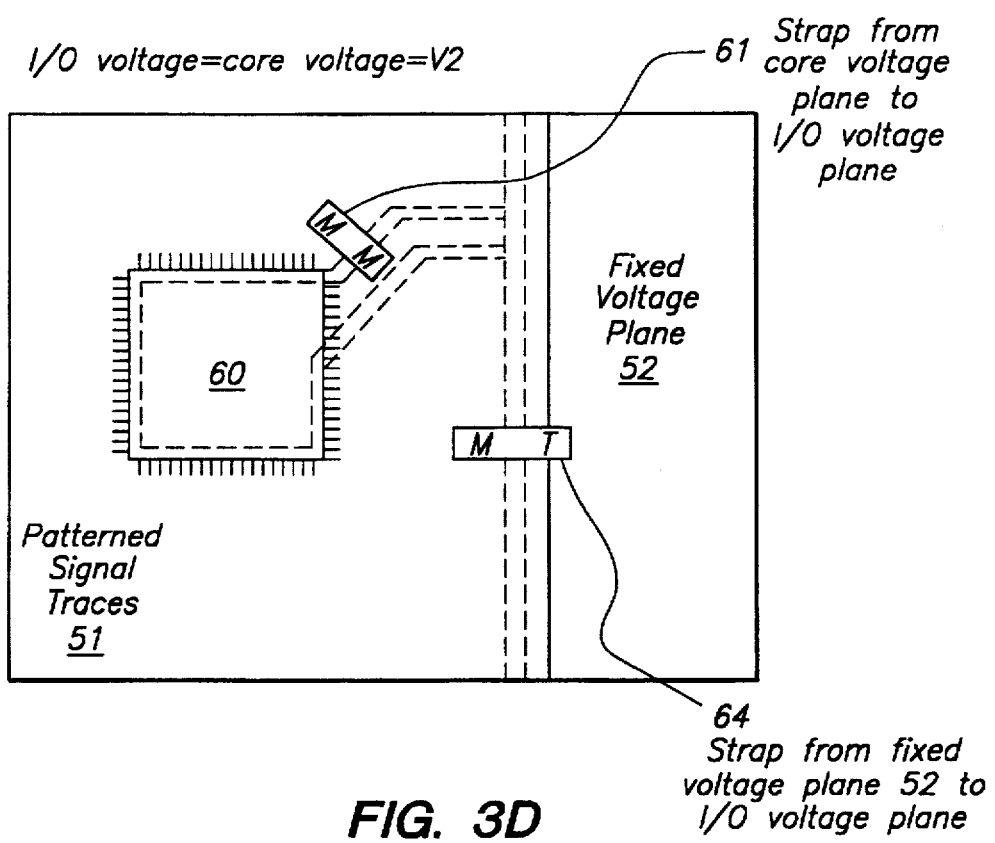
Figure 3E:
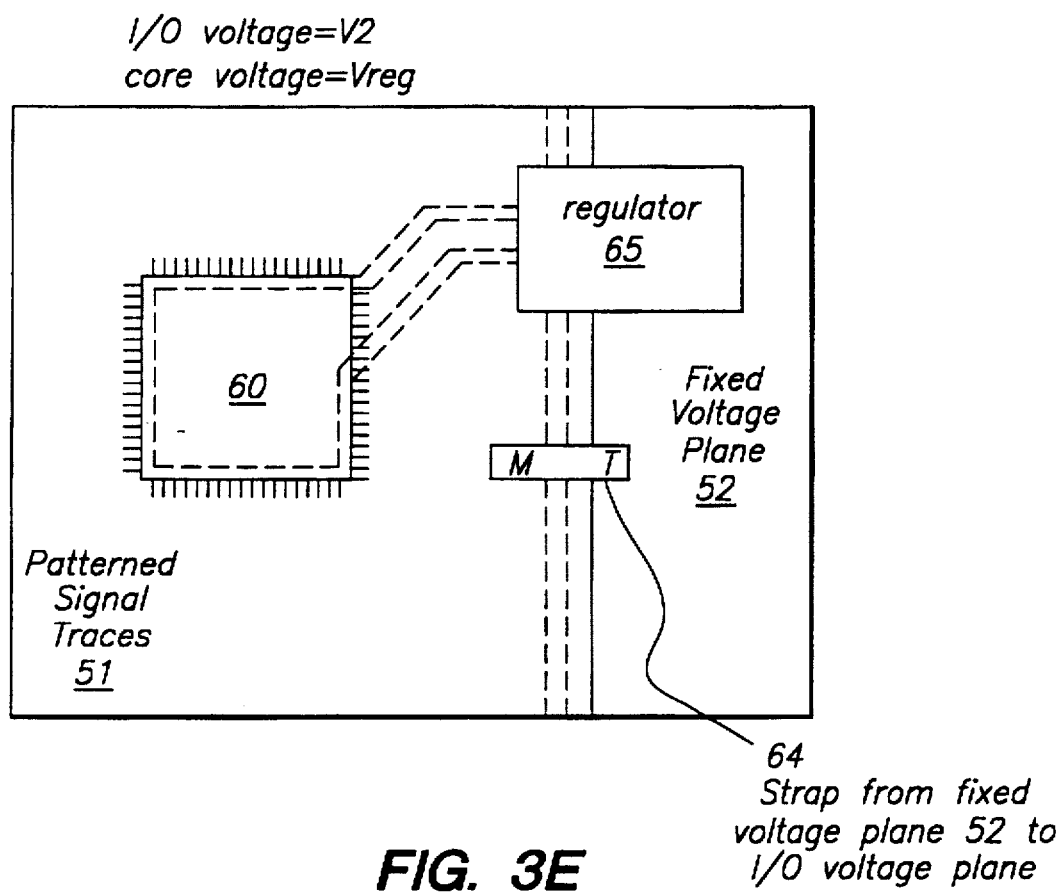

FIGS. 3C–3E illustrate some of the different voltage supply configurations that are possible with an embodiment of the PCB having top and middle layers as shown in FIGS. 3A and 3B.

FIG. 3C illustrates top and middle layers 40 and 50 together with inserted IC device 60 and jumpers 61 and 62. The dashed lines in FIG. 3C indicate the boundaries of the middle voltage supply planes residing under top layer 50. Jumper 61 straps from the middle layer area corresponding to core voltage plane 41 to the middle layer area corresponding to I/O voltage plane 42. Jumper 62 straps from the middle layer I/O voltage plane 42 to the middle layer fixed voltage plane 43. As a result, both the core voltage plane and the I/O voltage plane are defined by voltage supply V1, (i.e. $V_{core\ plane} = V_{I/O\ plane} = V1$).

In FIG. 3D jumper 61 again straps the core and I/O voltage planes together. However, in this configuration jumper 64 straps I/O voltage plane 42 to fixed voltage plane 52 making $V_{core\ plane} = V_{I/O\ plane} = V2$.

FIG. 3E shows the PCB with voltage regulator 65. The output voltage of regulator 65 is coupled to the core voltage plane through the top conductive layer 50. As a result, the core voltage is set to any voltage that the regulator can provide. The I/O plane is strapped to top plane 52. Thus, for this voltage supply configuration $V_{core\ plane} = V_{regulator}$ and $V_{I/O\ plane} = V2$. Alternatively, a jumper from the I/O voltage plane to the middle fixed voltage plane could replace jumper 64 in which case, $V_{core\ plane} = V_{regulator}$ and $V_{I/O\ plane} = V1$.

In one embodiment of the present invention V1 equals 3.3 volts and V2 equals 5.0 volts. Consequently, an IC device requiring a core voltage of 3.3 volts and an I/O voltage of 5.0 volts could be mounted on a PCB of the present invention having the configuration shown in FIG. 3E. In this configuration, the regulator may also be set to a voltage other than 3.3 volts if desired. An IC device requiring that both the core and I/O voltages to be either 3.3 volts or 5.0 volts could be inserted in the PCB designs shown in FIGS. 3C and 3D.

Figure 4:
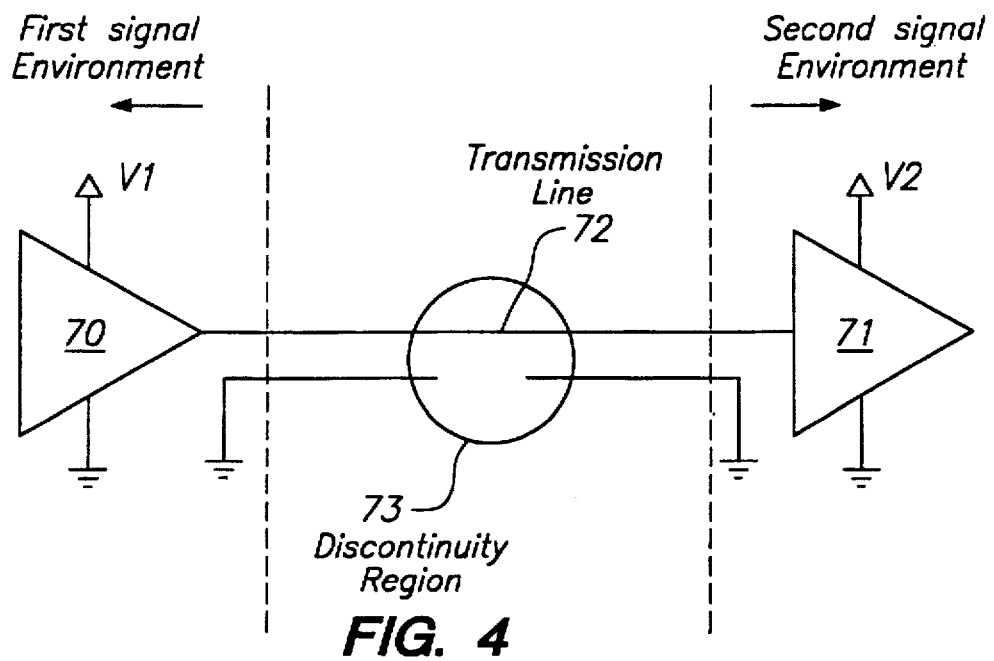
FIG. 4 illustrates the signal transmission environment that occurs when utilizing two voltage supplies such as is done with the PCB of the present invention.

In order to achieve optimum signal fidelity while implementing the PCBs and method of the present invention, capacitors are employed to by-pass each of the supply voltages to ground and to by-pass the supply voltages to each other. FIG. 4 illustrates the signal transmission environment that occurs when utilizing two power supplies such as is done with the PCB of the present invention. As shown, driver 70 having a first voltage source and ground drives a transmission line 72 coupled to receiver 71 having a second voltage source and ground. When a signal is transmitted along transmission line 72 from driver 70, it initially sees a first impedance $z_o$ which is typical of most transmission lines. However, when the signal goes from a first signal environment having V1 as the source voltage supply and a second signal environment having V2 as the receiver voltage supply, the impedance of transmission line 72 jumps due to the discontinuity 73 of the current path. For instance the line impedance may jump from $z_o = 50$ ohms to $z_o = 250$ ohms. As a result, signals are reflected back along the transmission line, reducing signal fidelity.

The present invention reduces this effect by inserting by-pass capacitors between each of the power supplies and ground, and between each power supply and the other power supply. For example, in the case in which two voltage supplies are employed, a capacitor configuration such as that shown in FIG. 5 is inserted between the two different signal environments.

Figure 5:
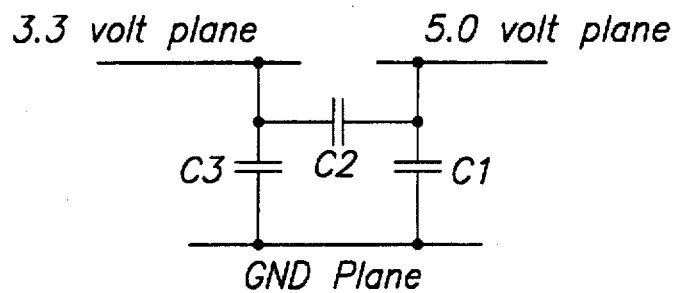
FIG. 5 shows a capacitor configuration that is employed with the PCB of the present invention in the case in which two voltage supplies are utilized.

FIG. 5 shows a capacitor C1 between 5.0 volts and ground, capacitor C2 between 5.0 volts and 3.3 volts, and capacitor C3 between 3.3 volts and ground.

It should be apparent that the present invention is not limited to the specific voltage supply plane lay-outs shown in FIGS. 3A–3E. The present invention may be applied to any other circuit designs and layouts which include more IC devices and other components. For instance, the layout may include additional voltage planes to accommodate other IC device voltage requirements and configurations.

Figure 6:
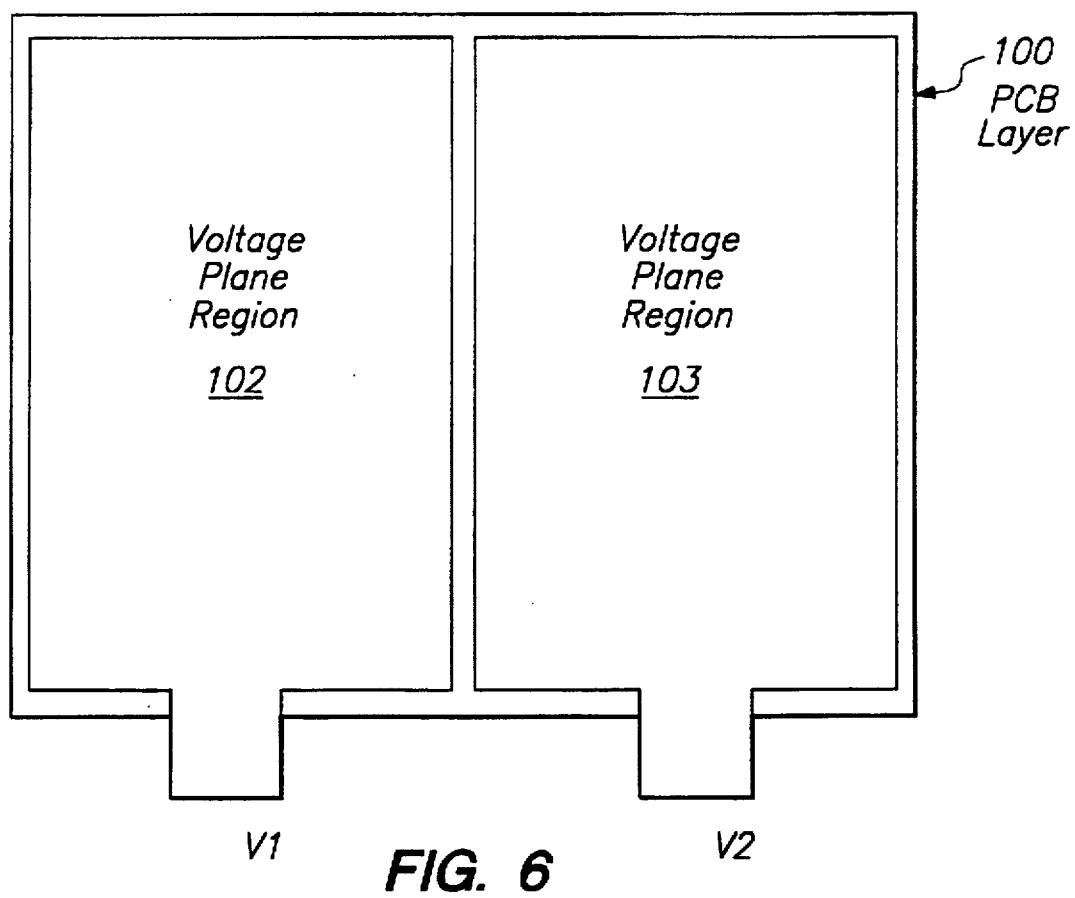
FIG. 6 shows a first embodiment of a split voltage plane of the present invention.
Figure 7:
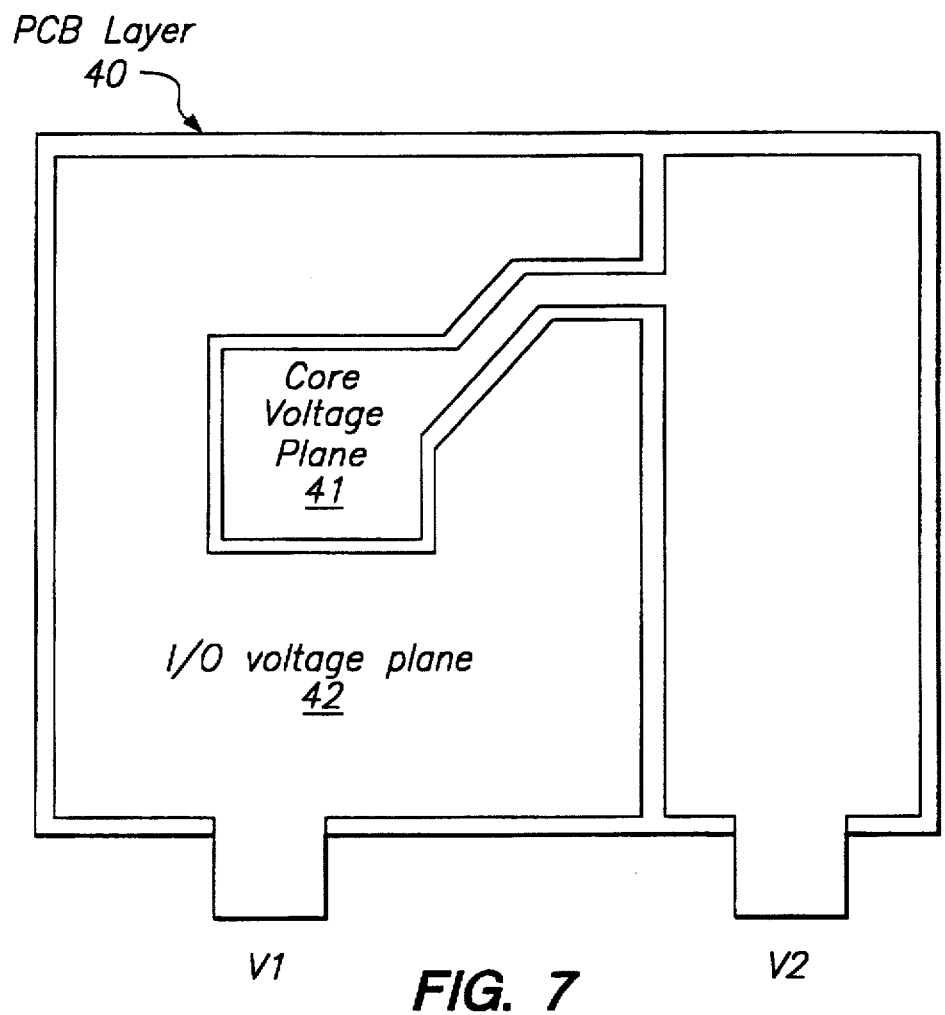
FIG. 7 shows a second embodiment of a split voltage plane of the present invention.

Finally, FIGS. 6 and 7 illustrate embodiments of the present invention that accommodate circuit designs requiring multiple voltage supplies with fixed split voltage supply regions. By including multiple voltage supply planes in a single conductive PCB layer, the number of PCB layers may be reduced by a factor of two. For instance, a PCB having four voltage supply planes—one per conductive layer, can be reduced to two conductive layers having two voltage supply planes per layer. In the field of PCB design this results in a reduction in overall cost of the PCB.

In this embodiment, a PCB voltage plane is split into electrically isolated voltage planes dependent on the voltage requirements and placement of the devices in the circuit being interconnected and held by the PCB. These planes are fixedly coupled to external voltage supplies. As shown in FIG. 6, a PCB 100 has a split voltage plane including a first voltage plane region 102 connectable to a voltage V1 and a second voltage plane region 103 connectable to a voltage V2. In this embodiment, device placement on PCB 100 becomes dependent on individual voltage supply requirements. For instance, devices requiring a voltage supply of V1 might generally be placed on the PCB to facilitate connection with plane region 102 whereas devices requiring a voltage supply of V2 might be placed for easy connection to plane region 103. Thus, although this PCB requires two different supply voltages, the PCB of the present invention requires only a single conductive layer. This is in contrast to prior art techniques in which one conductive layer is required per power supply voltage.

FIG. 7 illustrates a second embodiment in which the planes are split in a configuration to facilitate a particular circuit design layout such as that previously described in FIGS. 3A–3E. As described previously, device 60 (FIG. 3C) is coupled to the PCB such that a first group of its power supply pins are connected to I/O core voltage plane 42 and a second group of its power supply pins are connected to its core voltage plane 41 (as shown in FIG. 3B). Power supply pins coupled to core voltage region 41 in FIG. 7 can be coupled to a supply voltage equal to V2 and supply pins coupled to I/O voltage region 42 can be coupled to a supply voltage equal to V1. Thus, a single conductive layer accommodates a circuit having two different supply voltage requirements. A variation of this embodiment is to couple a plane region to a voltage regulator instead of an external voltage supply, thereby fixing the voltage plane to a voltage determined by the voltage regulator.

Consequently, although the elements of the present invention have been described in conjunction with certain embodiments, it will be appreciated that the invention may be implemented in a variety of other ways. It is to be understood that the particular embodiments shown and described by way of illustration are in no way intended to be limiting. Reference to the details of these embodiments is not intended to limit the scope of the claims which themselves recite only those features regarded as essential to the invention.

We claim:

1. A printed circuit board for coupling and holding a circuit having at least one device, said device having a first set of power supply pins having a first voltage supply requirement and a second set of power supply pins having a second voltage supply requirement, said printed circuit board comprising:

at least a first conductive layer having a plurality of electrically isolated voltage supply plane regions including a first fixed voltage supply plane region having a fixed connection with said first set of power supply pins and being connectable to a first power supply voltage, said isolated voltage supply regions also including a second fixed voltage supply plane region having a fixed connection with said second set of power supply pins and being connectable to a second power supply voltage.

2. The printed circuit board as described in claim 1 wherein said first power supply voltage is provided by a voltage regulator.

3. The printed circuit board as described in claim 2 wherein said first fixed voltage supply plane region is situated beneath said device and said second fixed voltage supply plane region is situated around said device.

4. The printed circuit board as described in claim 3 further including a first by-pass capacitor coupled between said first fixed voltage supply plane region and said second fixed voltage supply plane region.

5. The printed circuit board as described in claim 4 further including a ground plane, a second by-pass capacitor, and a third by-pass capacitor, said second by-pass capacitor being coupled between said first fixed voltage supply plane region and said ground plane and said third by-pass capacitor being coupled between said second fixed voltage supply plane region and said ground plane.

6. The printed circuit board as described in claim 5 wherein said device is a central processing unit of a computer system.

7. A printed circuit board for connecting and holding devices in a circuit, wherein said circuit comprises a device having a first power supply requirement for a first set of power supply pins and having a second power supply requirement for a second set of power supply pins, said printed circuit board (PCB) comprising:

at least one conductive layer of material being split into electrically isolated voltage supply plane regions including a first undefined voltage supply plane region coupled to said first set of power supply pins and a second undefined power supply region coupled to said second power supply pins, and a set of fixed voltage supply plane regions each being connectable to an associated power supply voltage.

8. The printed circuit board as described in claim 7 wherein said first undefined voltage supply plane region is situated beneath said device and said second undefined voltage supply plane region is situated around said device.

9. The printed circuit board as described in claim 7 wherein said PCB includes a voltage regulator that is connected between one of said fixed voltage supply regions and at least one of said undefined voltage supply regions for supplying a desired voltage thereto.

10. The printed circuit board as described in claim 7 wherein said PCB includes a plurality of first by-pass capacitors coupled between each of said fixed voltage supply plane regions.

11. The printed circuit board as described in claim 10 further comprising a conductive layer ground plane and a plurality of second by-pass capacitors coupled between each of said fixed voltage supply plane regions and said ground plane.

12. The printed circuit board as described in claim 7 wherein said integrated circuit device is a central processing unit of a computer system.

* * * * *